(12) United States Patent
Liaw

(10) Patent No.: US 12,317,601 B2
(45) Date of Patent: *May 27, 2025

(54) DUAL-PORT SRAM STRUCTURE

(71) Applicant: Taiwan Semiconductor Manufacturing Co., Ltd., Hsinchu (TW)

(72) Inventor: Jhon Jhy Liaw, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/439,486

(22) Filed: Feb. 12, 2024

(65) Prior Publication Data

US 2024/0186311 A1  Jun. 6, 2024

Related U.S. Application Data

(63) Continuation of application No. 17/811,260, filed on Jul. 7, 2022, now Pat. No. 11,901,352, which is a continuation of application No. 16/932,394, filed on Jul. 17, 2020, now Pat. No. 11,444,072.

(60) Provisional application No. 62/981,317, filed on Feb. 25, 2020.

(51) Int. Cl.
*H10D 89/10* (2025.01)
*H10B 10/00* (2023.01)
*H10D 84/85* (2025.01)

(52) U.S. Cl.
CPC ............ *H10D 89/10* (2025.01); *H10B 10/12* (2023.02); *H10D 84/853* (2025.01)

(58) Field of Classification Search
CPC ............ H01L 27/0207; H01L 27/0924; H01L 27/1104; H01L 29/785; G11C 7/1075; G11C 8/16; G11C 11/412; G11C 5/06; G11C 11/41; G11C 11/413; H10B 10/12; H10D 89/10; H10D 84/853; H10D 12/01
See application file for complete search history.

(56) References Cited

U.S. PATENT DOCUMENTS

| 8,009,463 | B2 | 8/2011 | Liaw |
| 8,189,368 | B2 | 5/2012 | Liaw |
| 8,315,084 | B2 | 11/2012 | Liaw |
| 8,675,397 | B2 | 3/2014 | Liaw |
| 8,830,732 | B2 | 9/2014 | Liaw |
| 8,964,455 | B2 | 2/2015 | Liaw |
| 8,995,176 | B2 | 3/2015 | Liaw |
| 9,099,172 | B2 | 8/2015 | Liaw |
| 9,373,386 | B2 | 6/2016 | Liaw |
| 9,418,728 | B2 | 8/2016 | Liaw |

(Continued)

*Primary Examiner* — Bac H Au
(74) *Attorney, Agent, or Firm* — Cooper Legal Group, LLC

(57) ABSTRACT

The static random access memory (SRAM) cell of the present disclosure includes a first pull-down device, a second pull-down device, a first pass-gate device, and a second pass-gate device in a first p-well on a substrate; a third pull-down device, a fourth pull-down device, a third pass-gate device, and a fourth pass-gate device in a second p-well on the substrate; a first pull-up device and a second pull-up device in an n-well between the first p-well and the second p-well; and a first landing pad between the second pull-down device and the first pull-up device. The first landing pad is electrically coupled to a gate structure of the second pass-gate device by way of a first gate via.

20 Claims, 10 Drawing Sheets

(56) References Cited

U.S. PATENT DOCUMENTS

| | | |
|---|---|---|
| 9,646,974 B1 | 5/2017 | Liaw |
| 9,773,545 B2 | 9/2017 | Liaw |
| 9,858,985 B2 | 1/2018 | Liaw |
| 9,916,896 B1 | 3/2018 | Arsovski |
| 10,050,042 B2 | 8/2018 | Chen |
| 10,916,550 B2 | 2/2021 | Liaw |
| 11,901,352 B2 * | 2/2024 | Liaw .................. H01L 27/0924 |
| 2021/0057421 A1 | 2/2021 | Liaw |

* cited by examiner

DUAL-PORT SRAM STRUCTURE

PRIORITY DATA

This application is a continuation of U.S. patent application Ser. No. 17/811,260, filed Jul. 7, 2022, which is a continuation of U.S. patent application Ser. No. 16/932,394, filed Jul. 17, 2020, which claims priority to U.S. Provisional Patent Application No. 62/981,317 filed on Feb. 25, 2020, entitled "DUAL-PORT SRAM STRUCTURE", each of which is hereby incorporated herein by reference in its entirety.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, these advances have also increased the complexity of processing and manufacturing semiconductor devices.

In deep sub-micron integrated circuit technology, an embedded static random access memory (SRAM) device has become a popular storage unit of high speed communication, image processing and system-on-chip (SOC) products. For example, a dual port (DP) SRAM device allows parallel operation, such as 1R (read) 1W (write), and 2R (read) or 2W (Write) in one cycle, and therefore has higher bandwidth than a single port SRAM. In advanced technologies with decreased feature size and increased packing density, low loading and high speed of the cell structure are important factors in embedded memory and SOC products. Dual port SRAM cell may have complex metal routing that may pose challenges in routing arrangement and lithography process windows. Therefore, although existing DP SRAM cells are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
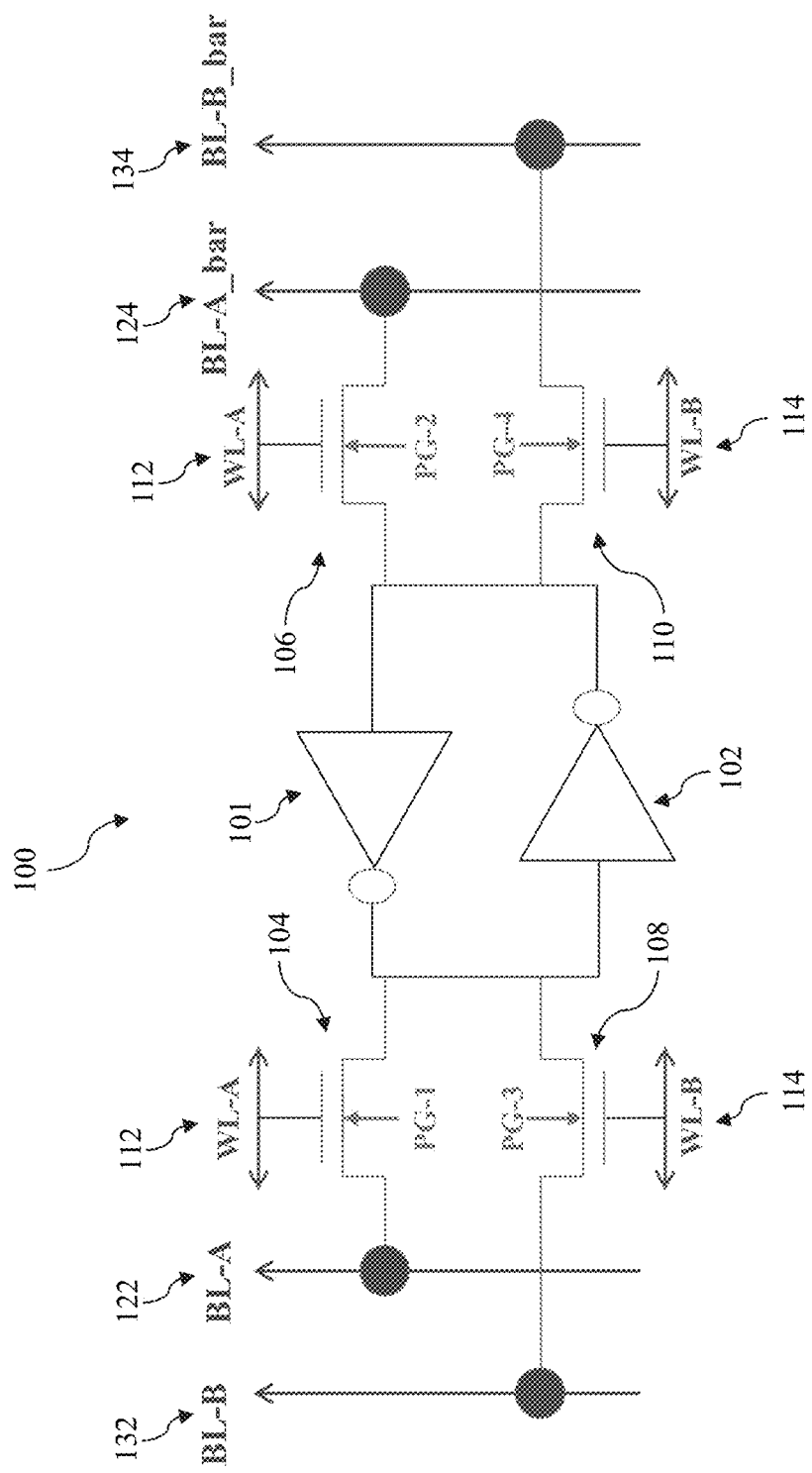
FIG. 1 is a schematic circuit diagram of a dual port static random access memory (DP SRAM) cell constructed according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Figure 2:
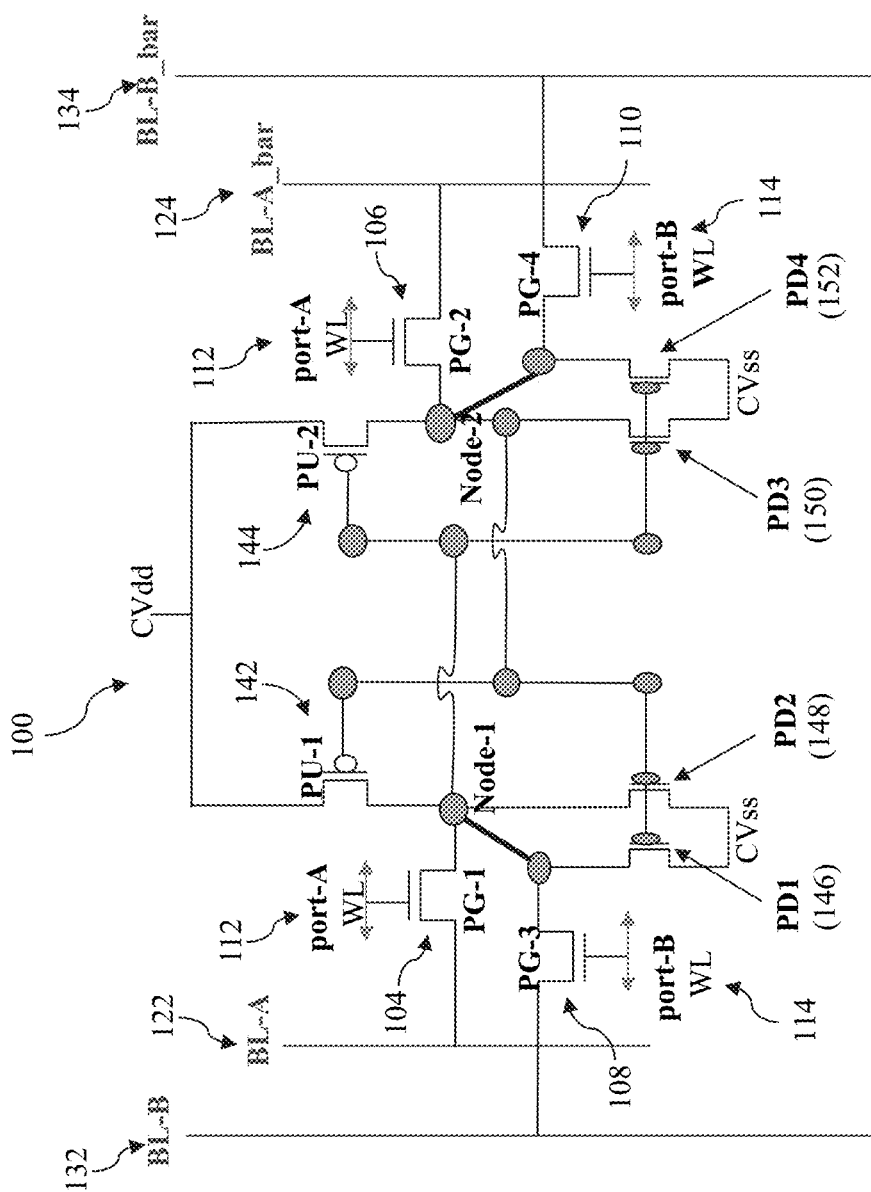
FIG. 2 is an alternative schematic circuit diagram of a DP SRAM cell constructed according to various aspects of the present disclosure.

FIGS. 1 and 2 are schematic circuit diagrams of a dual port static random access memory (DP SRAM) cell 100. The DP SRAM cell 100 may be implemented using planar field effect transistors (FETs) or multi-gate FETs. A planar FET includes a gate structure that may induce a planar channel region along one surface of its active region, hence its name.

A multi-gate FET includes a gate structure that is in contact with at least two surfaces of its active region. Examples of multi-gate FETs include fin-type FETs (FinFETs) and multi-bridge channel (MBC) FETs. A FinFET includes a fin-shaped active region arising from a substrate and a gate structure disposed over a top surface and sidewalls of the fin-shaped active region. A MBC FET includes at least one channel member extending between two source/drain features and a gate structure that wraps completely around the at least one channel member. Because of the feature that its gate structure wraps around the channel member, an MBC FET may also be referred to as a gate-all-around (GAA) FET or a surrounding gate transistor (SGT). Depending on the shapes and orientation, a channel member in a MBC FET may be referred to as a nanosheet, a semiconductor wire, a nanowire, a nanostructure, a nano-post, a nano-beam, or a nano-bridge. In some instances, an MBC FET may be referred to by the shape of the channel member. For example, an MBC FET having one or more nanosheet channel member may also be referred to as a nanosheet transistor or a nanosheet FET. For avoidance of doubts, embodiments of the present disclosure may be applicable to DP SRAM cell 100 that is implemented using planar FETs or multi-gate FETs.

In some embodiments, the DP SRAM cell 100 may include a total of 10 transistors and may be referred to as a 10T SRAM cell 100. Referring to FIG. 1, the DP SRAM cell 100 includes a first inverter 101 and a second inverter 102 that are cross-coupled. As shown in FIG. 2, the first inverter 101 includes a first pull-up device (PU-1) 142 formed with a p-type field-effect transistor (pFET), a first pull-down device (PD-1) 146 formed with an n-type FET (nFET), and a second pull-down device (PD-2) 148 formed with an nFET. The first pull-down device (PD-1) 146 and the second pull-down device (PD-2) 148 are configured in parallel mode. Specifically, the drains of the first pull-down device (PD-1) 146 and the second pull-down device (PD-2) 148 are electrically connected together, the corresponding sources thereof are electrically connected together, and the corresponding gates thereof are electrically connected together. The second inverter 102 includes a second pull-up device (PU-2) 144 formed with a pFET, a third pull-down device (PD-3) 150 formed with an nFET, and a fourth pull-down device (PD-4) 152 formed with an nFET. The third pull-down device (PD-3) 150 and the fourth pull-down device (PD-4) 152 are configured in parallel mode.

The drains of PU-1 (142), PD-1 (146) and PD-2 (148) are electrically connected together, defining a first drain node (also referred to as a first node or node 1). The drains of PU-2 (144), PD-3 (150) and PD-4 (152) are electrically connected together, defining a second drain node (also referred to as a second node or node 2). The gates of PU-1 (142), PD-1 (146) and PD-2 (148) are electrically connected and coupled to the second node. The gates of PU-2 (144), PD-3 (150) and PD-4 (152) are electrically connected and coupled to the first node. The sources of PU-1 (142) and PU-2 (144) are electrically connected to the power line (Vdd or CVdd). The sources of PD-1 (146), PD-2 (148), PD-3 (150), and PD-4 (152) are electrically connected to a complementary power line (Vss or CVss).

The DP SRAM cell 100 further includes a first port (port-A) 112 and a second port (port-B) 114. In one embodiment, the port-A 112 and port-B 114 include at least four pass-gate devices, referred to as PG-1 (104), PG-2 (106), PG-3 (108), and PG-4 (110), respectively. The port-A 112 includes a first pass-gate device (PG-1) 104 and a second pass-gate device (PG-2) 106. The port-B 114 includes a third pass-gate device (PG-3) 108 and a fourth pass-gate device (PG-4) 110. The drain of PG-1 (104) is electrically connected to a first bit-line 122 (referred to as BL-A). The source of PG-1 (104) is electrically connected to the first node. The gate of PG-1 (104) is electrically connected to a first word-line 112 (referred to as port-A WL). The drain of PG-2 (106) is electrically connected to a first bit-line bar 124 (BL-A bar). The source of PG-2 (106) is electrically connected to the second node. The gate of PG-2 (106) is electrically connected to a first word-line 112 (port-A WL). The drain of PG-3 (108) is electrically connected to a second bit-line 132 (BL-B). The source of PG-3 (108) is electrically connected to the first node. The gate of PG-3 (108) is electrically connected to the second word-line 114 (port-B WL). The drain of PG-4 (110) is electrically connected to a second bit-line bar 134 (BL-B bar). The source of PG-4 (110) is electrically connected to the second node. The gate of PG-4 (110) is electrically connected to the second word-line 114 (port-B WL). It is noted that, for ease of reference, both port-A and port-A WL share the same reference number 112 and both port-B and port-B WL share the same reference numeral 114. It can be seen from FIG. 2 that the DP SRAM cell 100 includes two pull-up devices (PU-1 and PU-2), four pull-down devices (PD-1, PD-2, PD-3, and PD-4), and four pass-gate devices (PG-1, PG-2, PG-3, and PG-4), which may be implemented using 10 transistors (10T), such as 10 planar FETs or 10 multi-gate FETs.

Figure 3:
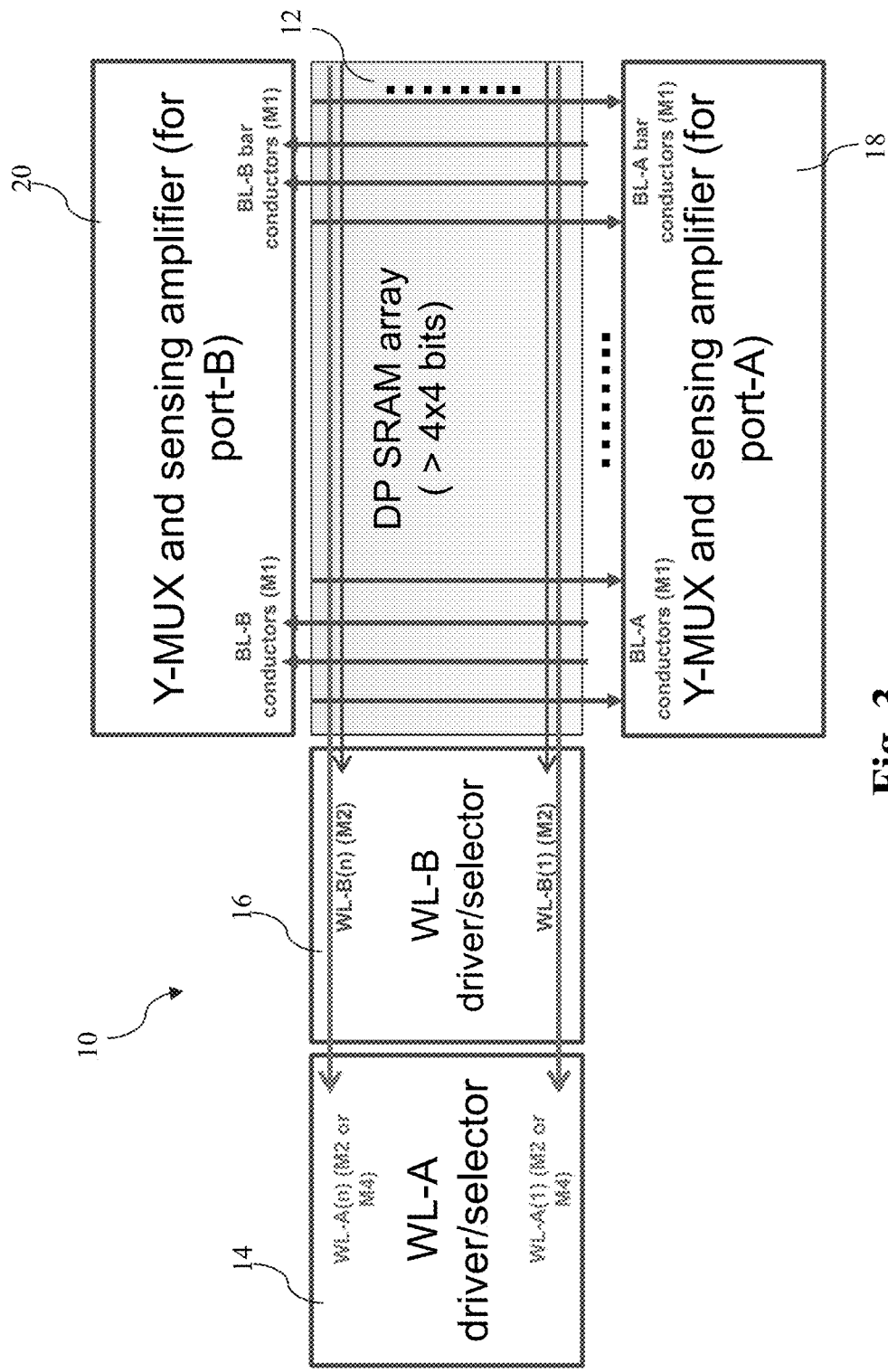
FIG. 3 is a schematic illustration of a DP SRAM array constructed according to various aspects of the present disclosure.
Figure 5:
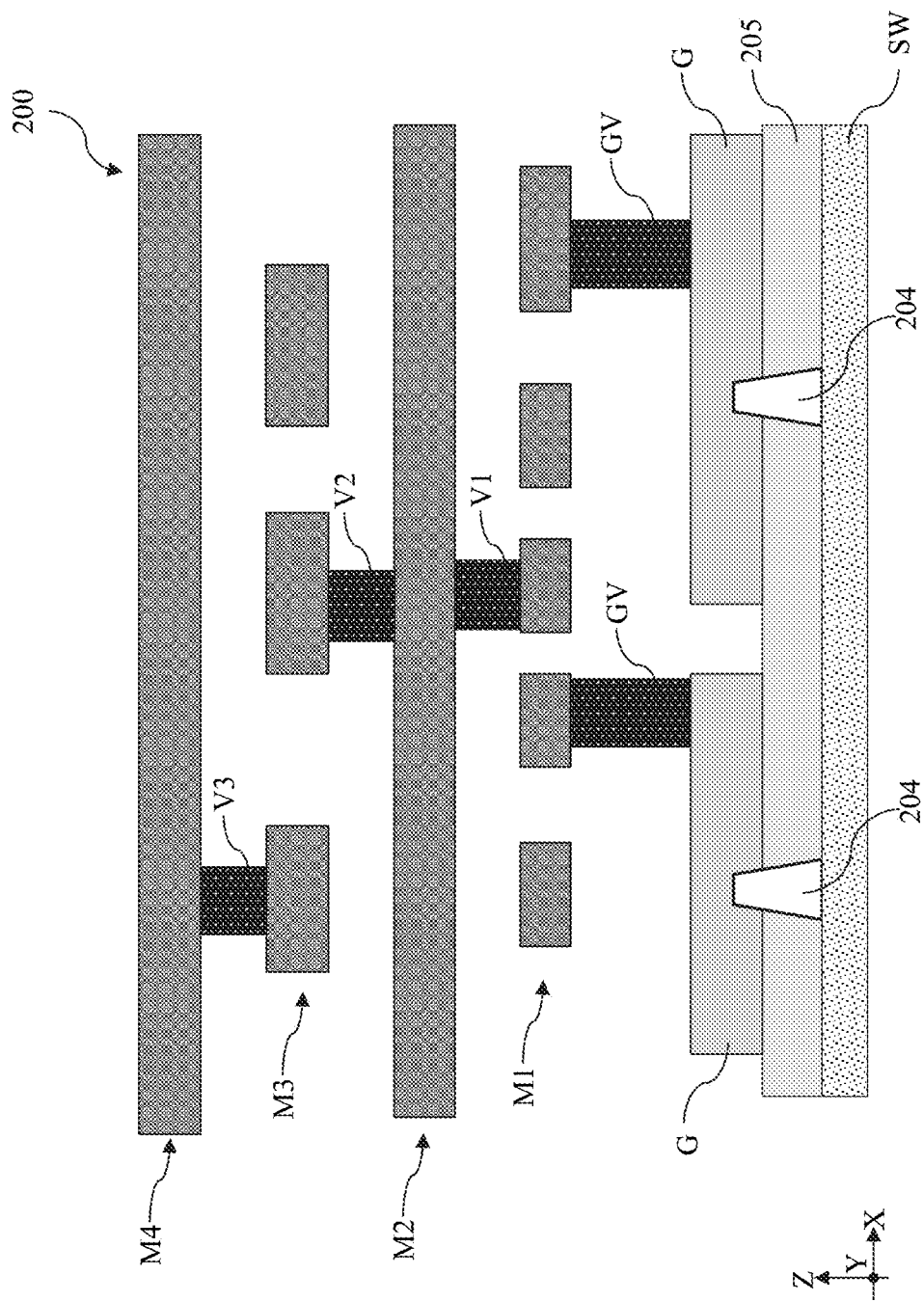
FIG. 5 is a schematic illustration of various metal layers of a DP SRAM cell viewed along a direction of active regions, according to various aspects of the present disclosure.
Figure 6:
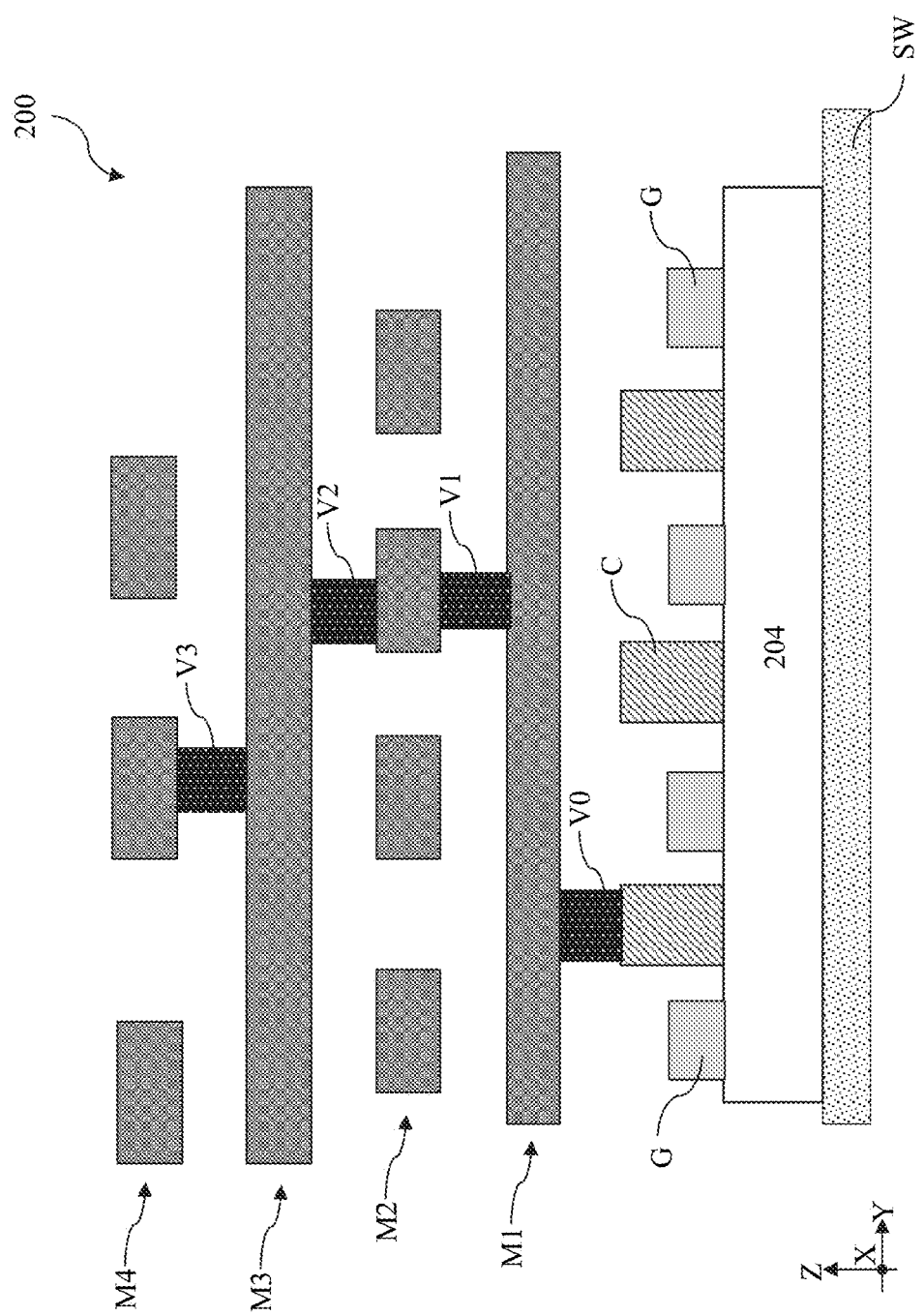
FIG. 6 is a schematic illustration of various metal layers of a DP SRAM cell viewed along a direction of gate structures, according to various aspects of the present disclosure in one embodiment.

FIG. 3 is a schematic illustration of a DP SRAM device 10. As shown in FIG. 3, the DP SRAM device 10 includes an SRAM array 12 comprised of 4×4 or more dual-port SRAM cells each of which may have the circuit layout shown in FIGS. 1 and 2. The first word-lines (WL-A) of the dual-port SRAM cells in the SRAM array 12 are connected to and controlled by a first word-line (WL-A) driver/selector 14, and the second word-lines (WL-B) of the dual-port SRAM cells in the SRAM array 12 are connected to and controlled by a second word-line (WL-B) driver/selector 16. According to various aforementioned embodiments, the first and second word-lines WL-A and WL-B of the dual-port SRAM cells in the SRAM array 12 are formed in the same or different metal layers, such as the second metal layer (M2) or and the fourth metal layer (M4). For example, the first word-line WL-A is formed in the second metal layer (M2) and the second word-line WL-B is formed in the fourth metal layer (M4). For another example, both the first word-line WL-A and the second word-line WL-B are formed in the second metal layer (M2). The different metal layers are illustrated in FIGS. 5 and 6 and will be described in more details below.

Still referring to FIG. 3, the first bit-line (BL-A) and the first bit-line bar (BL-A bar) of the dual-port SRAM cells in the SRAM array 12 are connected to a first Y-multiplexer (MUX) and sensing amplifier 18. When the first word-line WL-A is selected, the first bit-line (BL-A) and the first bit-line bar (BL-A bar) of an SRAM cell can be selected and data transmitted thereof can be read and sensed (or written) by the first Y-multiplexer (MUX) and sensing amplifier 18. The second bit-line (BL-B) and the second bit-line bar (BL-B bar) of the dual-port SRAM cells in the SRAM array 12 are connected to a second Y-multiplexer (MUX) and sensing amplifier 20. When the second word-line WL-B is selected, the second bit-line (BL-B) and the second bit-line bar (BL-B bar) of an SRAM cell can be selected and data transmitted thereof can be read and sensed (or written) by the second Y-multiplexer (MUX) and sensing amplifier 20. According to various embodiments according to the present disclosure, the first bit-line (BL-A), the first bit-line bar (BL-A bar), the second bit-line (BL-B), and the second bit-line bar (BL-B bar) of the dual-port SRAM cells can be formed in the same metal layer, such as the first metal layer (M1), shown in FIGS. 5 and 6.

Figure 4A:
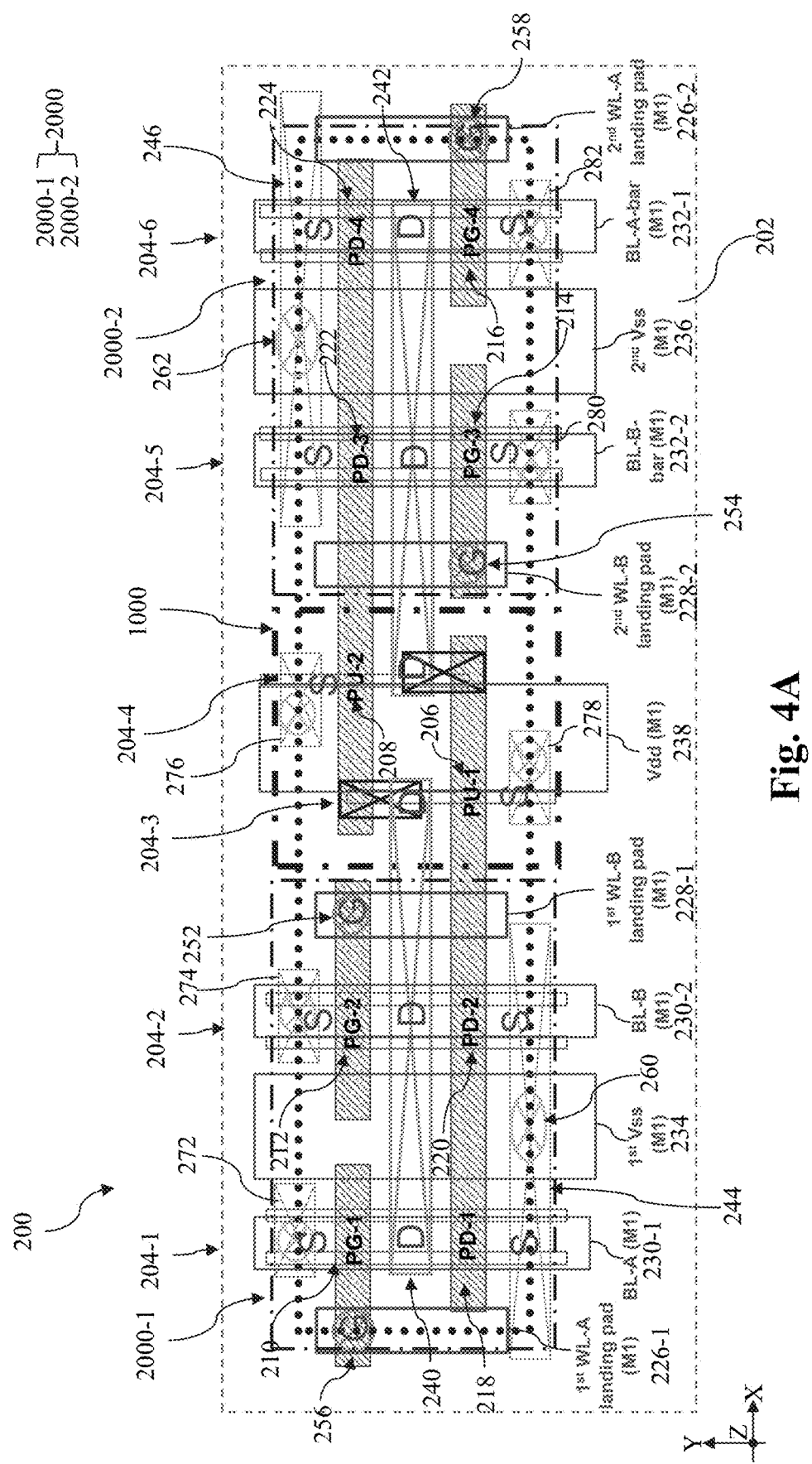
FIG. 4A is a schematic layout of a DP SRAM cell, according to various aspects of the present disclosure.
Figure 4B:
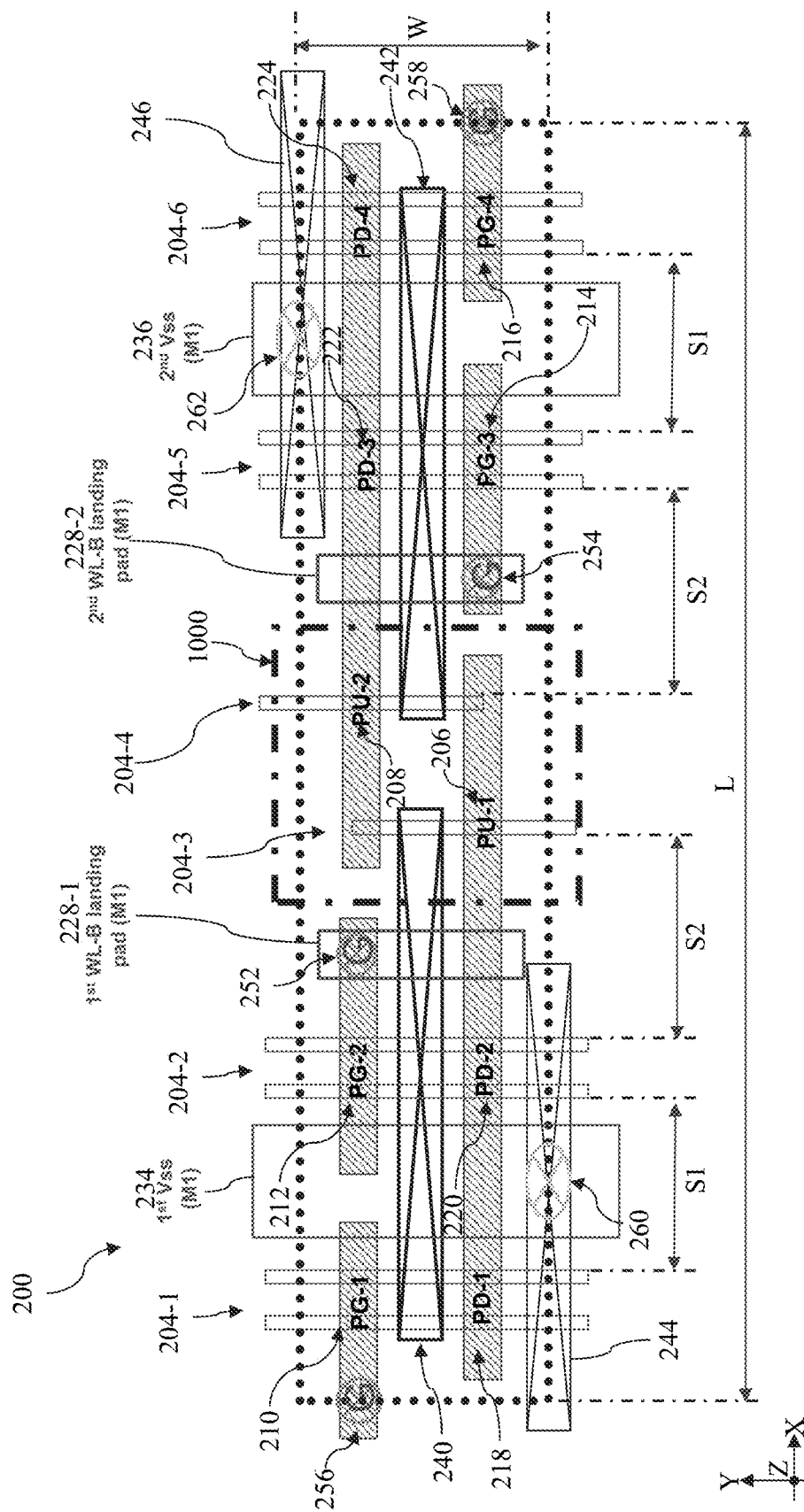
FIG. 4B is a simplified schematic layout of the DP SRAM cell in FIG. 4A, according to various aspects of the present disclosure.

To illustrate routing features in the DP SRAM cell 100 shown in FIGS. 1 and 2, schematic layout of a DP SRAM cell is illustrated in FIGS. 4A and 4B. Because the schematic layout in FIGS. 4A and 4B illustrates further features than the circuit diagrams in FIGS. 1 and 2, a different set of reference numerals is adopted for FIGS. 4A and 4B. It is noted, however, although different references numerals may be used in features in FIGS. 1, 2, 4A and 4B, devices and nodes identified in FIGS. 1 and 2 have corresponding counterparts in FIGS. 4A and 4B. For example, a DP SRAM cell, PG-1, PG-2, PG-3, PG-4, PD-1, PD-2, PD-3, PD-4, PU-1, PU-2, WL-A, WL-B, BL-A, BL-B, BL-A bar, BL-B bar, Vss, Vdd in FIGS. 1 and 2 correspond to similar features in FIG. 4A or 4B, despite of their different reference numerals. As compared to the schematic layout in FIG. 4A, the one shown in FIG. 4B is simplified to illustrate example inventive features of the present disclosure.

Reference is first made to FIG. 4A. A DP SRAM cell 100 shown in FIGS. 1 and 2 may be implemented as the DP SRAM cell 200 shown in FIG. 4A. The DP SRAM cell 200 may be fabricated on a substrate 202. In some embodiments, the substrate 202 may include a semiconductor material, such as silicon or silicon germanium. In some alternative embodiments, the substrate 202 may be a silicon-on-insulator (SOI) that include an insulating layer on a supporting bulk wafer for isolation and a silicon layer over the insulating layer. An SOI substrate may be formed using different techniques including Separation by Implanted Oxygen (SIMOX), Bonding and Etching Back SOI (BESOI), and Zone Melting and Recrystallization (ZMR) SOI. The substrate 202 may include different doped regions. In embodiments illustrated in FIG. 4A, with respect to the DP SRAM cell 200, the substrate 202 may include an n-type well 1000, which is doped with an n-type dopant, such as phosphorus (P) and arsenide (As), and a first p-type well 2000-1 and a second p-type well 2000-2, which are doped with a p-type dopant, such as boron (B). As will be described below, n-type devices are to be fabricated over the first and second p-type wells 2000-1 and 200-2, and p-type devices are to be fabricated over the n-type well 1000. In some implementations, when regarded beyond the boundary of the DP SRAM cell 200, the first p-type well 2000-1 and the second p-type well 2000-2 may be different regions of the same p-type well 2000. With respect to the DP SRAM cell 200, the n-type well 1000 is sandwiched between the first p-type well 2000-1 and the second p-type well 2000-2.

The DP SRAM cell 200 includes a first active region 204-1, a second active region 204-2, a third active region 204-3, a fourth active region 204-4, a fifth active region 204-5, and a sixth active region 204-6. Each of the active regions extend lengthwise along the Y direction. In some embodiments illustrated in FIG. 4A, each the first active region 204-1, the second active region 204-2, the fifth active region 204-5, and the sixth active region 204-6 includes two fin structures or a two vertical stacks of channel members while each of the third active region 204-3 and the fourth active region 204-4 includes a single fin structure or a single vertical stack of channel members. Other numbers of active regions, arrangements and implementations are possible and are fully envisioned by the present disclosure. In some implementations, the first pull-up device (PU-1) 206 is formed over the third active region 204-3, the second pull-up device (PU-2) 208 is formed over the fourth active region 204-4, the first pass-gate device (PG-1) 210 and the first pull-down device (PD-1) 218 are formed over the first active region 204-1, the second pass-gate device (PG-2) 212 and the second pull-down device (PD-2) 220 are formed over the second active region 204-2, the third pull-down device (PD-3) 222 and the third pass-gate device (PG-3) 214 are formed over the fifth active region 204-5, and the fourth pull-down device (PD-4) 224 and the fourth pass-gate device (PG-4) 216 are formed over the sixth active region 204-6. In some instances illustrated in FIG. 4A, the first pass-gate device (PG-1) 210, the second pass-gate device (PG-2) 212, the third pass-gate device (PG-3) 214, and the fourth pass-gate device (PG-4) 216 each have its own gate structure that extend lengthwise along the X direction, which is perpendicular to the Y direction. The first pull-down device (PD-1) 218, the second pull-down device (PD-2) 220, the first pull-up device (PU-1) 206 share one gate structure that also extends lengthwise along the X direction. The third pull-down device (PD-3) 222, the fourth pull-down device (PD-4) 224, the second pull-up device (PU-2) 208 share one gate structure that also extends lengthwise along the X direction.

The DP SRAM cell 200 includes gate vias and source/drain contacts form connections to the gate structures and sources/drains of the transistors therein. Referring to FIG. 4A, in some embodiments, the DP SRAM cell 200 includes a first gate via 252, a second gate via 254, a third gate via 256, and a fourth gate via 258. The first gate via 252 is disposed over and electrically coupled to the gate structure of the second pass-gate device (PG-2) 212. Along the X direction, the first gate via 252 is disposed over an isolation feature between the second active region 204-2 and the third active region 204-3. The isolation feature may be a shallow trench isolation (STI) feature and is representatively shown in FIG. 5. The first gate via 252 electrically couples the gate structure of the second pass-gate device (PG-2) 212 to a first WL-B landing pad 228-1. The first WL-B landing pad 228-1 extends lengthwise along the Y direction and is situated between the second active region 204-2 and the third active region 204-3. The second gate via 254 is disposed over and electrically coupled to the gate structure of the third pass-gate device (PG-3) 214. Along the X direction, the second gate via 254 is disposed over an isolation feature (e.g., an STI feature) between the fourth active region 204-4 and the fifth active region 204-5. The second gate via 254 electrically couples the gate structure of the third pass-gate device (PG-3) 214 to a second WL-B landing pad 228-2. The second WL-B landing pad 228-2 extends lengthwise along the Y direction and is situated between the fourth active region 204-4 and the fifth active region 204-5. The third gate via 256 is disposed over and electrically coupled to the gate structure of the first pass-gate device (PG-1) 210. Along the X direction, the third gate via 256 is disposed at an end or boundary of the DP SRAM cell 200. The third gate via 256 electrically couples the gate structure of the first pass-gate device (PG-1) 210 to a first WL-A landing pad 226-1. The first WL-A landing pad 226-1 extends lengthwise along the Y direction and is situated at an end or a boundary of the DP SRAM cell 200. The fourth gate via 258 is disposed over and electrically coupled to the gate structure of the fourth pass-gate device (PG-4) 216. Along the X direction, the fourth gate via 258 is disposed at the opposite end or boundary of the DP SRAM cell 200. The fourth gate via 258 electrically couples the gate structure of the fourth pass-gate device (PG-4) 216 to a second WL-A landing pad 226-2. The second WL-A landing pad 226-2 extends lengthwise along the Y direction and is situated at the opposite end or boundary of the DP SRAM cell 200. Along the Z direction, each of the gate vias may have a circular shape, an oval shape, a racetrack shape, a square shape, or a rectangular shape. In some embodiments, because the third gate via 256 and the fourth gate via 258 are disposed at boundaries of the DP SRAM cell 200, they may be enlarged to reduce resistance and improve performance of the DP SRAM cell 200. On the contrary, the first gate via 252 and the second gate via 254 are disposed within active regions of the DP SRAM cell 200, the room to enlarge them may be limited. As a result, in those embodiments, the X-Y plane projection area of the third gate via 256 and the fourth gate via 258 is greater than the X-Y plane projection area of the first gate via 252 and the second gate via 254.

Drains (or drain features) of the first pull-down device (PD-1) 218, the second pull-down device (PD-2) 220, and the first pull-up device (PU-1) 206 are electrically coupled to a first long contact 240. The first long contact 240 extends lengthwise along the X direction over the first active region 204-1, the second active region 204-2, and the third active region 204-3. As shown in FIG. 4A, the first long contact 240 is disposed between the gate structure of the first pass-gate device (PG-1) 210 and the common gate structure of the first pull-down device (PD-1) 218, the second pull-down device (PD-2) 220, and the first pull-up device (PU-1) 206. Similarly, the first long contact 240 is disposed between the gate structure of the second pass-gate device (PG-2) 212 and the common gate structure of the first pull-down device (PD-1) 218, the second pull-down device (PD-2) 220, and the first pull-up device (PU-1) 206. The first long contact 240 is disposed between the common gate structure of the first pull-down device (PD-1) 218, the second pull-down device (PD-2) 220, and the first pull-up device (PU-1) 206 and the common gate structure of the third pull-down device (PD-3) 222, the fourth pull-down device (PD-4) 224, and the second pull-up device (PU-2) 208. As shown in FIG. 4A, because the first long contact 240 extends along the X direction to span over the first WL-B landing pad 228-1 (which extends lengthwise along the Y direction), the first gate via 252 may be adjacent to the first long contact 240. As used herein, a long contact refers to a contact feature that physically spans over more than one source/drain region. For example, the first long contact 240 physically spans over the drains of the first pull-down device (PD-1) 218, the second pull-down device (PD-2) 220, and the first pull-up device (PU-1) 206. Alternatively, a long contact refers to a contact feature that physically spans over more than one active region. For example, the first long contact 240 physically spans over the first active region 204-1, the second active region 204-2, and the third active region 204-3.

Drains (or drain features) of the third pull-down device (PD-3) 222, the fourth pull-down device (PD-4) 224, and second pull-up device (PU-2) 208 are electrically coupled to a second long contact 242. The second long contact 242 extends lengthwise along the X direction over the fourth active region 204-4, the fifth active region 204-5, and the sixth active region 204-6. As shown in FIG. 4A, the second long contact 242 is disposed between the gate structure of the fourth pass-gate device (PG-4) 216 and the common gate structure of the third pull-down device (PD-3) 222, the fourth pull-down device (PD-4) 224, and the second pull-up device (PU-2) 208. Similarly, the second long contact 242 is disposed between the gate structure of the third pass-gate device (PG-3) 214 and the common gate structure of the third pull-down device (PD-3) 222, the fourth pull-down device (PD-4) 224, and the second pull-up device (PU-2) 208. The second long contact 242 is disposed between the common gate structure of the first pull-down device (PD-1) 218, the second pull-down device (PD-2) 220, and the first pull-up device (PU-1) 206 and the common gate structure of the third pull-down device (PD-3) 222, the fourth pull-down device (PD-4) 224, and the second pull-up device (PU-2) 208. As shown in FIG. 4A, because the second long contact 242 extends along the X direction to span over the second WL-B landing pad 228-2 (which extends lengthwise along the Y direction), the second gate via 254 may be adjacent to the second long contact 242.

Sources (or source features) of the first pull-down device (PD-1) 218 and the second pull-down device (PD-2) 220 are electrically coupled to a third long contact 244. The third long contact 244 extends lengthwise along the X direction over the first active region 204-1 and the second active region 204-2. Sources (or source features) of the third pull-down device (PD-3) 222 and the fourth pull-down device (PD-4) 224 are electrically coupled to a fourth long contact 246. The fourth long contact 246 extends lengthwise along the X direction over the fifth active region 204-5 and the sixth active region 204-6.

In addition to the first, second, third, and fourth long contacts, the first pass-gate device (PG-1) 210 has a first source contact 272, the second pass-gate device (PG-2) 212 has a second source/drain contact 274, the first pull-up device (PU-1) 206 has a fourth source contact 278, the second pull-up device (PU-2) has a third source contact 276, the third pass-gate device (PG-3) has a fifth source contact 280, and the fourth pass-gate device (PG-4) has a sixth source contact 282. As shown in FIG. 4A, by way of a contact via, the first source contact 272 is electrically coupled to the first bit line (BL-A) 230-1. In a similar fashion, the second source contact 274 is electrically coupled to the second bit line (BL-B) 230-2, the sixth source contact 282 is electrically coupled to the first bit line bar (BL-A bar) 232-1, and the fifth source contact 280 is electrically coupled to the second bit line bar (BL-B bar) 232-2. By means of contact vias, the third source contact 276 and the fourth source contact 278 are electrically coupled to a power line (Vdd) 238. By way of a first Vss via 260, the third long contact 244 is electrically coupled to a first complimentary power line ($1^{st}$ Vss) 234. By way of a second Vss via 262, the fourth long contact 246 is electrically coupled to a second complimentary power line ($2^{nd}$ Vss) 236.

Referring still to FIG. 4A, each of the first WL-A landing pad 226-1, the first bit line (BL-A) 230-1, the first complimentary power line ($1^{st}$ Vss) 234, the second bit line (BL-B) 230-2, the first WL-B landing pad 228-1, the power line (Vdd) 238, the second WL-B landing pad 228-2, the second bit line bar (BL-B bar) 232-2, the second complimentary power line ($2^{nd}$ Vss) 236, the first bit line bar (BL-A bar) 232-1, and the second WL-A landing pad 226-2 extends lengthwise along the Y direction, parallel to the lengthwise directions of the active regions (204-1~6). In some embodiments, the first WL-A landing pad 226-1, the first bit line (BL-A) 230-1, the first complimentary power line ($1^{st}$ Vss) 234, the second bit line (BL-B) 230-2, the first WL-B landing pad 228-1, the power line (Vdd) 238, the second WL-B landing pad 228-2, the second bit line bar (BL-B bar) 232-2, the second complimentary power line ($2^{nd}$ Vss) 236, the first bit line bar (BL-A bar) 232-1, and the second WL-A landing pad 226-2 may be disposed in a first metal layer (M1).

Referring to FIG. 4B, when viewed along the Z direction, the DP SRAM cell 200 is rectangular in shape and the elongated along the X direction. In some embodiments, the DP SRAM cell 200 includes a length L along the X direction and a width W along the Y direction. A ratio of the length L to the width W may be between about 4 and about 7. The smaller width W may reduce the line length of bit lines and bit line bars to reduce ohmic drop (i.e., IR drop) along the length of the bit lines and bit line bars. By situating the first WL-B landing pad 228-1 between the n-type second active region 204-2 and the p-type third active region 204-3, the spacing between the n-type second active region 204-2 and the p-type third active region 204-3 may be increased. Similarly, by situating the second WL-B landing pad 228-2 between the n-type fifth active region 204-5 and the p-type fourth active region 204-4, the spacing between the n-type fifth active region 204-5 and the p-type fourth active region 204-4 may be increased as well. As a result, a first spacing S1 between adjacent n-type active regions is smaller than a second spacing S2 between a n-type active region and an adjacent p-type active region. For example, the first active region 204-1 and the second active region 204-2, both being n-type, are spaced part along the X direction by the first spacing S1. The fifth active region 204-5 and the sixth active region 204-6, both being n-type, are spaced apart from one another along the X direction by the first spacing S1 as well. The n-type second active region 204-2 and the p-type third active region 204-3 are spaced apart from one another by the second spacing S2. The n-type fifth active region 204-5 and the p-type fourth active region 204-4 are spaced apart from one another by the second spacing S2. As described above with respect to FIG. 4A, each the first active region 204-1, the second active region 204-2, the fifth active region 204-5, and the sixth active region 204-6 includes two fin structures or a two vertical stacks of channel members while each of the third active region 204-3 and the fourth active region 204-4 includes a single fin structure or a single vertical stack of channel members. Therefore, the first spacing S1 refers to the smallest fin-to-fin or stack-to-stack spacing between fins/stacks in the first active region 204-1 and counterparts in the second active region 204-2 or the smallest fin-to-fin or stack-to-stack spacing between fins/stacks in the fifth active region 204-5 and counterparts in the sixth active region 204-6. Similarly, the second spacing S2 refers to the smallest fin-to-fin or stack-to-stack spacing between fins/stacks in the second active region 204-2 and the fin/stack in the third active region 204-3 or the smallest fin-to-fin or stack-to-stack spacing between fins/stacks in the fifth active region 204-5 and the fin/stack in the fourth active region 204-4.

In some implementations, a ratio of the second spacing S2 to the first spacing S1 may be between about 1.05 and about 2.00. The greater second spacing S2 may provide benefits. For example, the greater second spacing S2 may allow larger spacing between the n-type well 1000 and the p-type well 2000 (including the first p-type well 2000-1 and the second p-type well 2000-2), which may result in reduced well isolation leakage and increase device immunity to latch-up and soft-error-rate. For another example, the greater second spacing S2 may make room for a larger n-type well, which may lead to a more balance performance characteristics of the DP SRAM cell 200. As can be seen from FIGS. 4A and 4B, in a DP SRAM cells 200, the p-type well 2000 (including the first p-type well 2000-1 and the second p-type well 2000-2) is greater than the n-type well 1000 in terms of area. Increasing the area of the n-type well helps balance the performance of the DP SRAM cell 200. Moreover, because the first complimentary power line ($1^{st}$ Vss) 234 and the second complimentary power line ($2^{nd}$ Vss) 236 are the only metal line disposed between adjacent n-type active regions (between the first active region 204-1 and the second active region 204-2 or between the fifth active region 204-5 and the sixth active region 204-6), the first complimentary power line ($1^{st}$ Vss) 234 and the second complimentary power line ($2^{nd}$ Vss) 236 may be wider to make room for larger first Vss via 260 and the second Vss via 262, which may lead to improved performance of the DP SRAM cell 200. Compared to the gate vias (252, 254, 256, and 258), the first Vss via 260 and the second Vss via 262 have larger dimensions. For example, when both gate vias and Vss vias are substantially rectangular, gate vias have a first dimension D1 and the Vss vias have a second dimension D2 along the lone side. In some instances, a ratio of the second dimension D2 to the first dimension D1 may be between about 1.1 and about 4.

Various metal layers and contact vias of the DP SRAM cell 200 are illustrated in FIGS. 5 and 6. FIG. 5 is a schematic illustration of metal layers viewed along the Y direction and FIG. 6 is a schematic illustration of metal layers viewed along the X direction. For simplicity of illustrate, in FIGS. 5 and 6, the first, second, third, fourth, fifth and sixth active regions (204-1~6 in FIG. 4A) may be representatively shown as an active region 204; the gate structures of the 10 transistors (PU-1, PU-2, PG-1~4, and PD-1~4 in FIG. 4A) may be representatively shown as a gate structure G; the first, second, third, and fourth gate vias (252, 254, 256, and 258 in FIG. 4A) may be representatively shown as a gate via GV; source contacts (272, 274, 276, 278, 280, and 282 in FIG. 4A), long contacts (240, 242, 244, and 246 in FIG. 4A) may be representatively shown as C in FIG. 6; source/drain contact vias may be representatively shown as Vo; and the n-type well 1000 and p-type well 2000 (including the first p-type well 2000-1 and the second p-type well 2000-2) may be representatively shown as SW. An isolation layer 205, such as a shallow trench isolation (STI) layer, may be disposed between adjacent active regions 204 to provide isolation. Each of the active regions 204 may be disposed over an n-type well, such as the n-type well 1000 in FIG. 4A or over a p-type well, such as the p-type well 2000 (including the first p-type well 2000-1 and the second p-type well 2000-2) in FIG. 4A. Metal lines in the first metal layer (M1) extend lengthwise along the Y direction. Metal lines in the second metal layer (M2) extend lengthwise along the X direction. Metal lines in the third metal layer (M3) extend lengthwise along the Y direction. Metal lines in the fourth metal layer (M4) extend lengthwise along the X direction. First vias (V1) electrically couple the first metal layer (M1) and the second metal layer (M2). Second vias (V2) electrically couple the second metal layer (M2) and the third metal layer (M3). Third vias (V3) electrically couple the third metal layer (M3) and the fourth metal layer (M4). As described above, the first WL-A landing pad 226-1, the first bit line (BL-A) 230-1, the first complimentary power line ($1^{st}$ Vss) 234, the second bit line (BL-B) 230-2, the first WL-B landing pad 228-1, the power line (Vdd) 238, the second WL-B landing pad 228-2, the second bit line bar (BL-B bar) 232-2, the second complimentary power line ($2^{nd}$ Vss) 236, the first bit line bar (BL-A bar) 232-1, and the second WL-A landing pad 226-2 may be disposed in a first metal layer (M1).

Because the metal lines in the first metal layer (M1), the second metal layer (M2), the third metal layer (M3), and the fourth metal layer (M4) either extends along the X direction or along the perpendicular Y direction, the metal lines in the DP SRAM cell 200 do not include complex shapes, resulting in an improved yield. As shown in FIGS. 3, 5 and 6, the X-direction-extending second metal layer (M2) and the fourth metal layer (M4) may be used as the first word-line (WL-A) and the second word-line (WL-B) to couple to the first word-line (WL-A) driver/selector 14 and the second word-line (WL-B) driver/selector 16. The Y-direction extending first bit line (BL-A), first bit line bar (BL-A-bar), second bit-line (BL-B), and the second bit-line bar (BL-B-bar) may be coupled to the first Y-multiplexer (MUX) and sensing amplifier 18 or the second Y-multiplexer (MUX) and sensing amplifier 20.

Figure 7:
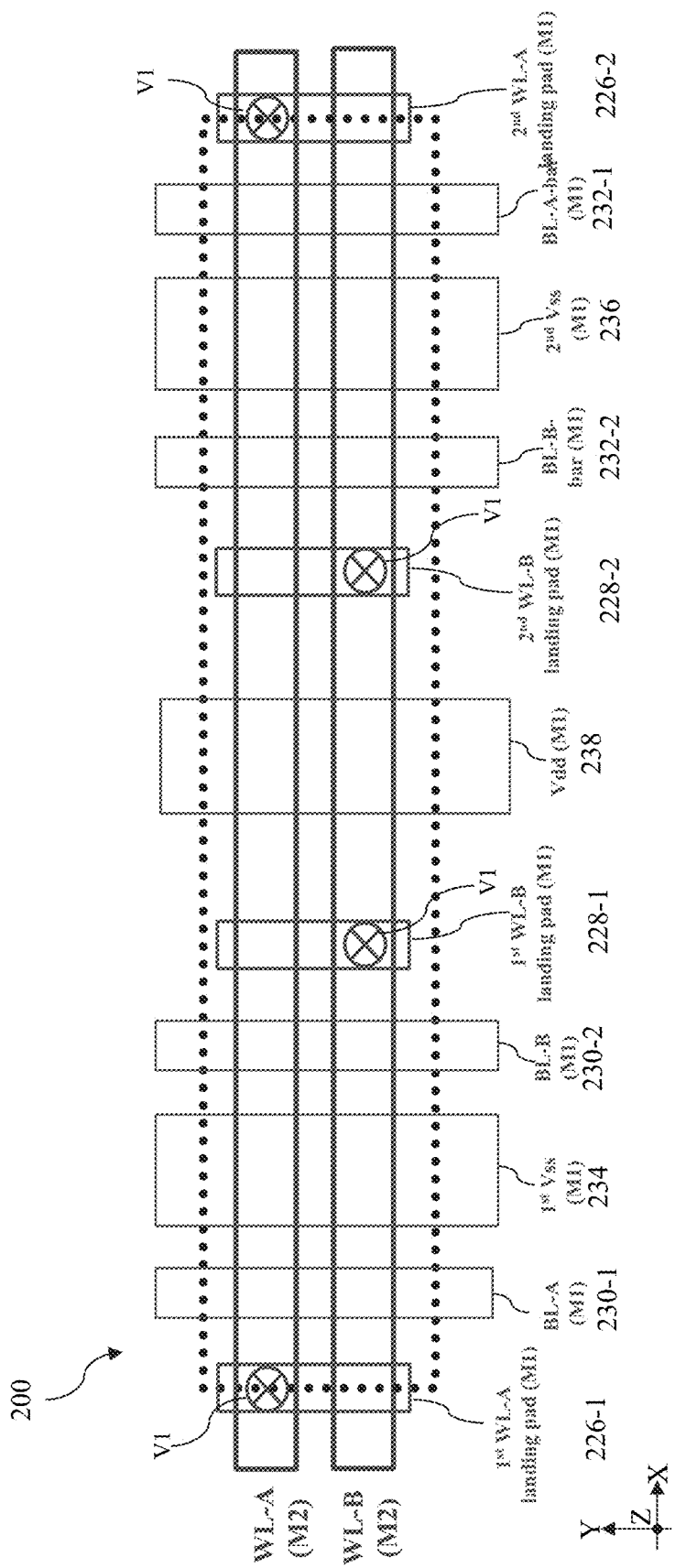
FIGS. 7, 8 and 9 illustrate embodiments of word lines of a DP SRAM cell, according to various aspects of the present disclosure.

In some embodiments illustrated in FIG. 7, both the first word-line (WL-A) and the second word-line (WL-B) may be implemented in the second metal layer (M2). In these implementations, the first word-line (WL-A) may be coupled to the first WL-A landing pad 226-1 and the second WL-A landing pad 226-2 by way of two first vias V1; and the second word-line (WL-B) may be coupled to the first WL-B landing pad 228-1 and the second WL-B landing pad 228-2 by way of two first vias V1.

Figure 8:
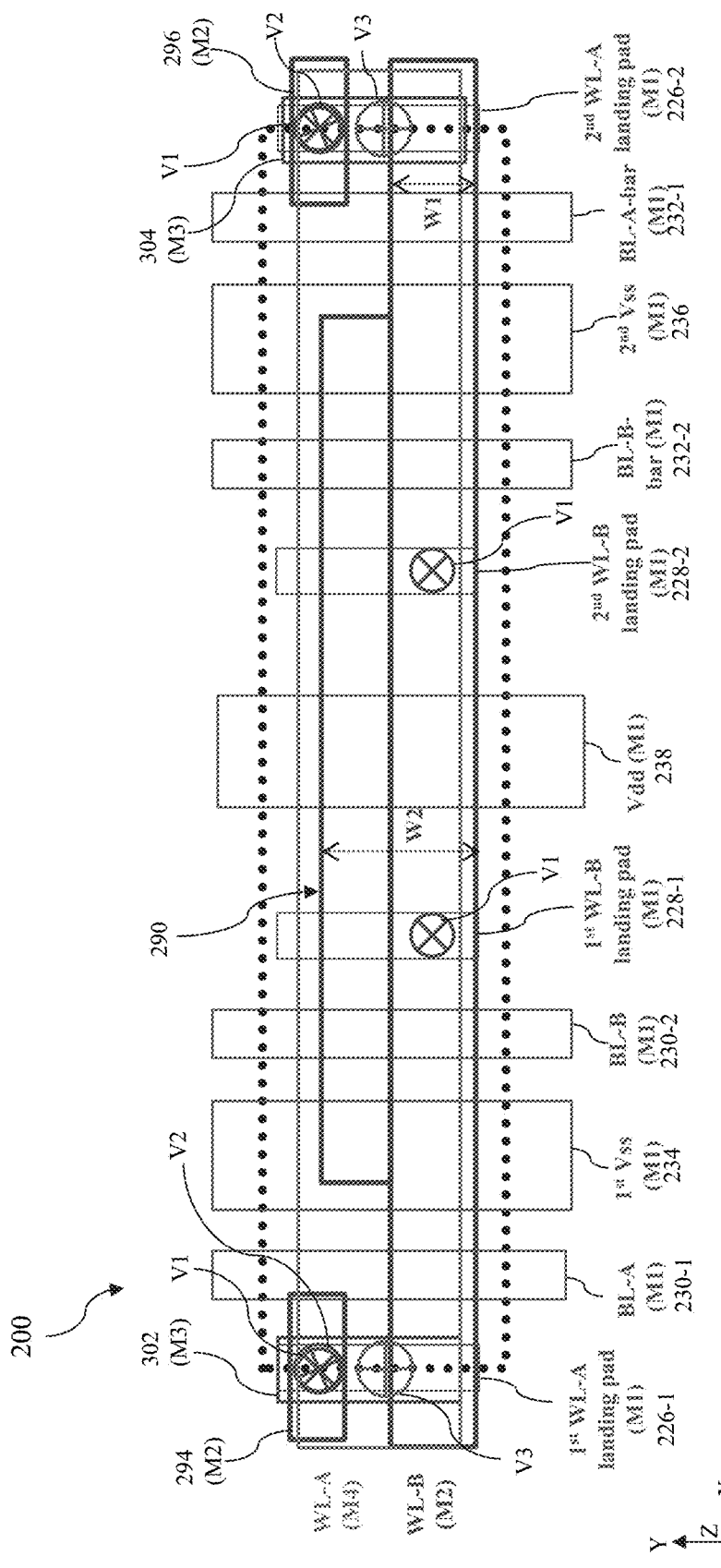

In some alternative embodiments shown in FIG. 8, the second word-line (WL-B) may be implemented in the second metal layer (M2) and the first word-line (WL-A) may be implemented in the fourth metal layer (M4). Because the first word-line (WL-A) and the second word-line (WL-B) are fabricated in different metal layers, a first metal jog feature 290 may be formed in the second metal layer (M2) to increase the width of the second word-line (WL-B) to reduce ohmic drop (i.e., IR drop). In some embodiments illustrated in FIG. 8, the second word-line (WL-B) has a first width W1 and the first metal jog feature 290 may boost the width to a second width W2. The second width W2 is greater than the first width W1. In these implementations, the second word-line (WL-B) may be coupled to the first WL-B landing pad 228-1 and the second WL-B landing pad 228-2 by way of two first vias V1. The first word-line (WL-A) may be coupled to the first WL-A landing pad 226-1 and the second WL-A landing pad 226-2 by way of two first vias V1, two contact pads 294 and 296 in the second metal layer (M2), two second vias V2, two contact pads 302 and 304 in the third metal layer (M3), and two third vias V3. The two contact pads 294 and 296 in the second metal layer (M2), two second vias V2, two contact pads 302 and 304 in the third metal layer (M3), and two third vias V3 help reroute the signal path between the fourth metal layer (M4) and the first WL-A landing pad 226-1 and the second WL-A landing pad 226-2.

Figure 9:
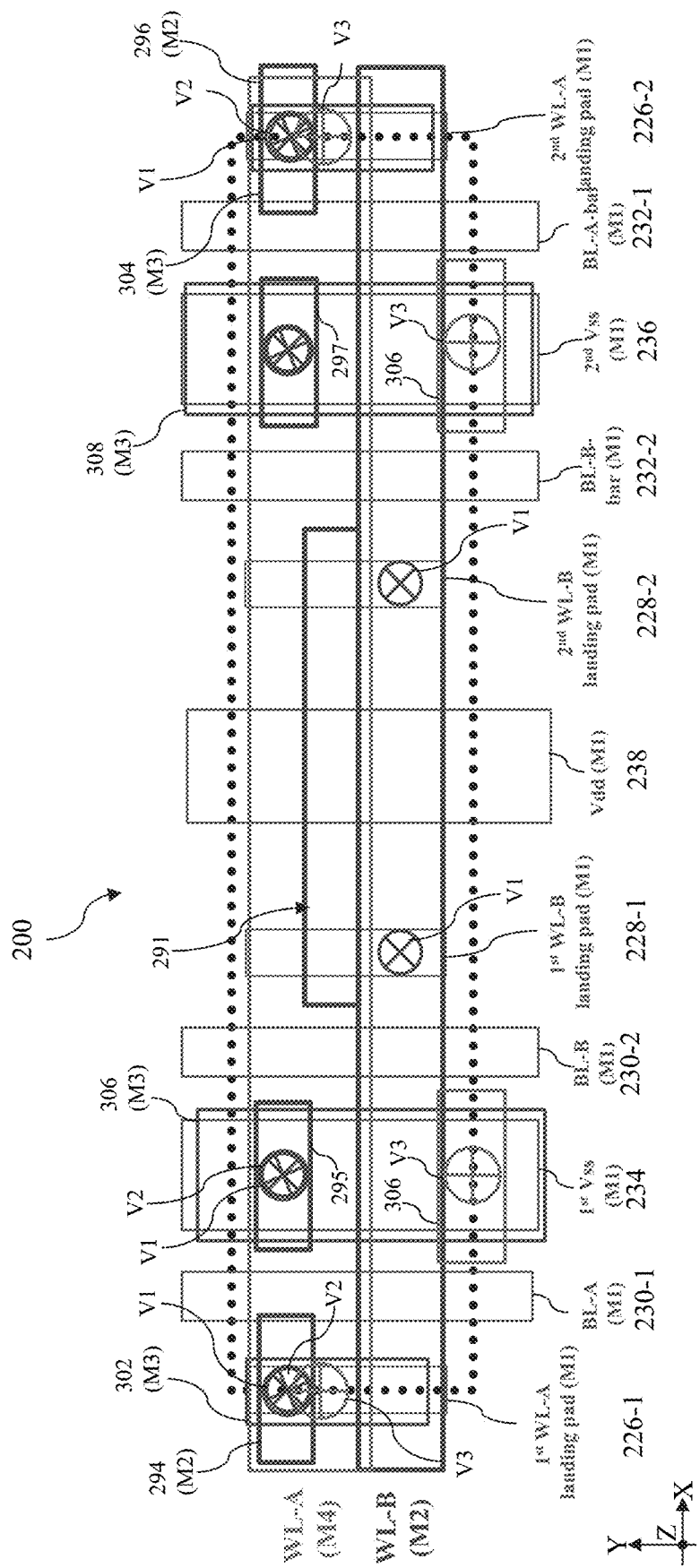

Further embodiments of metal layers may be illustrated in FIG. 9. Compared to the metal layer structures shown in FIG. 8, the metal layer structure in FIG. 9 further includes power mesh features may be incorporated in the metal layer structure shown in FIG. 8 to reduce ohmic drop (i.e., IR drop). As shown in FIG. 9, the first complimentary power line ($1^{st}$ Vss) 234 may be routed to the fourth metal layer (M4) by way of a first via V1, a contact pad 295 in the second metal layer (M2), a second via V2, a contact pad 306 in the third metal layer (M3), and a third via V3. Similarly, the second complimentary power line ($2^{nd}$ Vss) 236 may be routed to the fourth metal layer (M4) by way of a first via V1, a contact pad 297 in the second metal layer (M2), a second via V2, a contact pad 308 in the third metal layer (M3), and a third via V3. Because the contact pads 295 and 297 take up space in the second metal layer (M2), a second metal jog feature 291 in FIG. 9 in the second metal layer (M2) may be smaller than the first metal jog feature 290 in FIG. 8.

Although not intended to be limiting, one or more embodiments of the present disclosure provide benefits. For example, the present disclosure provides embodiments of a 10T SRAM cell that includes two pull-up devices (PU-1 and PU-2), fourth pull-down devices (PD-1, PD-2, PD-3, and PD-4), and four pass-gate devices (PG-1, PG-2, PG-3, and PG-4). The SRAM cell of the present disclosure includes word-line contact pads disposed between an n-type device and a p-type device to increase the spacing therebetween. The increased spacing allows reduction of latch up and reduction of soft-error-rate for improved performance. Additionally, the increased spacing between n-type and p-type devices allow room for a larger n-type well for a more balanced performance of the SRAM cell. To simplify routing structures and increase scalability, metal lines in one metal layer is orthogonal to those in an adjacent metal layer. An SRAM cell of the present disclosure includes a first long contact coupled to drains of the first pull-down device (PD-1), the second pull-down device (PD-2), and the first pull-up device (PU-1) and a second long contact are coupled to drains of the third pull-down device (PD-3), the fourth pull-down device (PD-4), and the second pull-up device (PU-2). The implementation of long contacts simplifies the routing structure.

Thus, in one aspect, the present disclosure provides an SRAM cell. The SRAM cell includes a first pull-down device (PD-1), a second pull-down device (PD-2), a first pass-gate device (PG-1), and a second pass-gate device (PG-2) disposed in a first p-well on a substrate, wherein active regions of the second pass-gate device (PG-2) and the second pull-down device (PD-2) are aligned along a first direction; a third pull-down device (PD-3), a fourth pull-down device (PD-4), a third pass-gate device (PG-3), and a fourth pass-gate device (PG-4) disposed in a second p-well on the substrate, wherein active regions of the third pass-gate device (PG-3) and the third pull-down device (PD-3) are aligned along the first direction; a first pull-up device (PU-1) and a second pull-up device (PU-2) disposed in an n-well disposed between the first p-well and the second p-well, where an active region of the first pull-up device (PU-1) extends along the first direction; and a first landing pad disposed between the second pull-down device (PD-2) and the first pull-up device (PU-1), wherein the first landing pad is electrically coupled to a gate structure of the second pass-gate device (PG-2) by way of a first gate via.

In some embodiments, the first gate via is disposed between the second pull-down device (PD-2) and the first pull-up device (PU-1). In some implementations, the SRAM cell may further include a second landing pad disposed between the third pull-down device (PD-3) and the second pull-up device (PU-2) and the second landing pad is electrically coupled to a gate structure of the second pass-gate device (PG-2) by way of a second gate via. In some embodiments, the second gate via is disposed between the third pull-down device (PD-3) and the second pull-up device (PU-2). In some embodiments, a drain of the first pull-down device (PD-1), a drain of the second pull-down device (PD-2), and a drain the first pull-up device (PU-1) are electrically coupled to a first long contact. In some instances, a drain of the third pull-down device (PD-3), a drain of the fourth pull-down device (PD-4), and a drain the second pull-up device (PU-2) are electrically coupled to a first long contact. In some implementations, a source of the first pull-down device (PD-1) and a source of the second pull-down device (PD-2) are electrically coupled to a third long contact. In some instances, a source of the third pull-down device (PD-3) and a source of the fourth pull-down device (PD-4) are electrically coupled to a third long contact.

In another aspect, the present disclosure provides an SRAM cell. The SRAM cell may include a first pull-down device (PD-1), a second pull-down device (PD-2), a first pass-gate device (PG-1), and a second pass-gate device (PG-2) disposed in a first p-well on a substrate; a third pull-down device (PD-3), a fourth pull-down device (PD-4), a third pass-gate device (PG-3), and a fourth pass-gate device (PG-4) disposed in a second p-well on the substrate; and a first pull-up device (PU-1) and a second pull-up device (PU-2) disposed in an n-well disposed between the first p-well and the second p-well. The first pull-down device (PD-1), the second pull-down device (PD-2), and the first pull-up device (PU-1) share a gate structure extending along a first direction and a drain of the first pull-down device (PD-1), a drain of the second pull-down device (PD-2), and a drain the first pull-up device (PU-1) are electrically coupled to a first long contact.

In some embodiments, the SRAM cell may further include a first landing pad disposed between the second pull-down device (PD-2) and the first pull-up device (PU-1) and the first landing pad is electrically coupled to a gate structure of the second pass-gate device (PG-2) by way of a first gate via. In some implementations, the first gate via is disposed adjacent to the first long contact. In some instances, a drain of the third pull-down device (PD-3), a drain of the fourth pull-down device (PD-4), and a drain the second pull-up device (PU-2) are electrically coupled to a second long contact. In some embodiments, the SRAM cell may further include a second landing pad disposed between the third pull-down device (PD-3) and the second pull-up device (PU-2). The second landing pad is electrically coupled to a gate structure of the second pass-gate device (PG-2) by way of a second gate via. In some implementations, the second gate via is disposed adjacent to the second long contact.

In still another aspect, the present disclosure provides an SRAM cell. The SRAM cell includes a first pull-down device (PD-1), a second pull-down device (PD-2), a first pass-gate device (PG-1), and a second pass-gate device (PG-2) disposed in a first p-well on a substrate; a third pull-down device (PD-3), a fourth pull-down device (PD-4), a third pass-gate device (PG-3), and a fourth pass-gate device (PG-4) disposed in a second p-well on the substrate; and a first pull-up device (PU-1) and a second pull-up device (PU-2) disposed in an n-well disposed between the first p-well and the second p-well. The first pass-gate device (PG-1) and the first pull-down device (PD-1) share a first active region extending along a first direction. The second pass-gate device (PG-2) and the second pull-down device (PD-2) share a second active region extending along the first direction. A third active region of the first pull-up device (PU-1) extends along the first direction. The first active region and the second active region are spaced apart by a first spacing. The second active region and the third active region are spaced apart by a second spacing greater than the first spacing.

In some embodiments, a ratio of the second spacing to the first spacing is between 1.05 and 2. In some implementations, the first active region includes two fin structures, the second active region includes two fin structures, and the third active region includes a single fin structure. In some implementations, the SRAM cell may further include a first landing pad disposed between the second pull-down device (PD-2) and the first pull-up device (PU-1). The first landing pad is electrically coupled to a gate structure of the second pass-gate device (PG-2) by way of a first gate via and the first landing pad extends along the first direction. In some instances, the SRAM cell may further include a first long contact. A drain of the first pull-down device (PD-1), a drain of the second pull-down device (PD-2), and a drain the first pull-up device (PU-1) are electrically coupled to the first long contact. In some implementations, the first long contact extends along a second direction perpendicular to the first direction and the first landing pad spans over the first long contact.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A static random access memory (SRAM) array, comprising:
   a plurality of memory cells, each of the plurality of memory cells comprising:
     a first active region and a second active region disposed over an n-well and extending along a first direction;
     a third active region and a fourth active region disposed over a first p-well abutting the n-well and extending along the first direction;
     a fifth active region and a sixth active region disposed over a second p-well abutting the n-well and extending along the first direction;
     a first gate structure extending along a second direction perpendicular to the first direction to wrap over the third active region, the fourth active region, and the first active region; and
     a second gate structure extending along the second direction to wrap over the second active region, the fifth active region, and the sixth active region,
   wherein the first p-well and the second p-well sandwiches the n-well along the second direction.

2. The SRAM array of claim 1,
   wherein each of the first active region and the second active region comprises a single fin,
   wherein each of the third active region, the fourth active region, the fifth active region, and the sixth active region comprises two fins.

3. The SRAM array of claim 1,
   wherein the third active region and the fourth active region is spaced apart by a first spacing,
   wherein the fourth active region and the first active region is spaced apart by a second spacing greater than the first spacing.

4. The SRAM array of claim 3, wherein a ratio of the second spacing to the first spacing is between about 1.05 and about 2.00.

5. The SRAM array of claim 1,
   wherein the third active region comprises a first source/drain region, a second source/drain region, a third source/drain region, a first channel region disposed between the first source/drain region and the second source/drain region, a second channel region disposed between the second source/drain region and the third source/drain region,
   wherein the fourth active region comprises a first source/drain region, a second source/drain region, a third source/drain region, a first channel region disposed between the first source/drain region and the second source/drain region, a second channel region disposed between the second source/drain region and the third source/drain region, wherein the first active region comprises a channel region disposed between a first source/drain region and a second source/drain region.

6. The SRAM array of claim 5, wherein the first gate structure wraps over the first channel region of the third active region, the first channel region of the fourth active region, and the channel region of the first active region.

7. The SRAM array of claim 5, wherein each of the plurality of memory cells further comprises:
a first long contact disposed over the second source/drain region of the third active region, the second source/drain region of the fourth active region, and the second source/drain region of the first active region.

8. The SRAM array of claim 7, wherein each of the plurality of memory cells further comprises:
a second long contact disposed over the first source/drain region of the third active region and the first source/drain region of the fourth active region.

9. A memory structure, comprising:
a substrate comprising an n-well disposed between a first p-well and a second p-well along a first direction;
a first fin and a second fin disposed over the n-well and extending along a second direction perpendicular to the first direction;
a first pair of fins and a second pair of fins disposed over the first p-well and extending along the second direction;
a third pair of fins and a fourth pair of fins disposed over the second p-well and extending along the second direction;
a first gate structure disposed over the first pair of fins;
a second gate structure disposed over the second pair of fins;
a third gate structure disposed over the third pair of fins; and
a fourth gate structure disposed over the fourth pair of fins,
wherein the first gate structure and the fourth gate structure are electrically coupled together by way of a first word line disposed in a first metal layer,
wherein the second gate structure and the fourth gate structure are electrically coupled together by way of a second word line disposed in a second metal layer different from the first metal layer.

10. The memory structure of claim 9, wherein the first metal layer is disposed over the second metal layer.

11. The memory structure of claim 9,
wherein the first word line and the second word line extend lengthwise along a first direction,
wherein the first word line comprises a first width along a second direction perpendicular to the first direction,
wherein the second word line comprises a second width along the second direction,
wherein the first width is greater than the second width.

12. The memory structure of claim 11, wherein a section of the second word line comprises a metal jog feature to increase the second width of the section of the second word line.

13. The memory structure of claim 11,
wherein the first gate structure and the second gate structure are aligned along the first direction,
wherein the third gate structure and the fourth gate structure are aligned along the first direction.

14. The memory structure of claim 13, further comprising:
a first common gate structure wrapping over the first fin, the first pair of fins and the second pair of fins; and
a second common gate structure wrapping over the second fin, the third pair of fins, and the fourth pair of fins,
wherein the first common gate structure extends parallel to the first gate structure and the second gate structure,
wherein the second common gate structure extends parallel to the third gate structure and the fourth gate structure.

15. The memory structure of claim 14,
wherein the first common gate structure is aligned with the third gate structure and the fourth gate structure along the first direction,
wherein the second common gate structure is aligned with the first gate structure and the second gate structure along the first direction.

16. A static random access memory (SRAM) cell, comprising:
a substrate comprising an n-well, a first p-well and a second p-well, the n-well being sandwiched between the first p-well and the second p-well;
a first transistor, a second transistor, a third transistor, and a fourth transistor disposed over the first p-well;
a fifth transistor and a sixth transistor disposed over the n-well; and
a seventh transistor, an eighth transistor, a ninth transistor, and a tenth transistor disposed over the second p-well,
wherein the first transistor and the third transistor share a first active region,
wherein the second transistor and the fourth transistor share a second active region,
wherein drains of the first transistor, the second transistor and the fifth transistor are electrically coupled together,
wherein drains of the seventh transistor, the eighth transistor and the sixth transistor are electrically coupled together.

17. The SRAM cell of claim 16, wherein sources of the first transistor and the second transistor are electrically coupled together.

18. The SRAM cell of claim 16,
wherein the first transistor, the second transistor, and the fifth transistor share a first common gate structure,
wherein the seventh transistor, the eighth transistor, and the sixth transistor share a second common gate structure.

19. The SRAM cell of claim 16, wherein each of the first active region and the second active region comprises two fins.

20. The SRAM cell of claim 16,
wherein the fifth transistor is disposed over a third active region,
wherein the sixth transistor is disposed over a fourth active region,
wherein each of the third active region and the fourth active region comprises a single fin.

* * * * *